Jan. 24, 1961 W. GLUCK 2,969,517

PIN GRIP FOR PRINTED CIRCUIT BOARD

Filed June 13, 1958 2 Sheets-Sheet 1

INVENTOR.
WILLIAM GLUCK
BY James and Franklin
ATTORNEYS

INVENTOR.
WILLIAM GLUCK
BY James and Franklin
ATTORNEYS

United States Patent Office 2,969,517

Patented Jan. 24, 1961

2,969,517

PIN GRIP FOR PRINTED CIRCUIT BOARD

William Gluck, Yonkers, N.Y., assignor to Industrial Electronic Hardware Corp., a corporation of New York Filed June 13, 1958, Ser. No. 741,843

10 Claims. (Cl. 339—17)

This invention relates to pin grips for electrical circuitry, and more particularly for printed circuitry.

The primary object of the present invention is to generally improve such pin grips. More particular objects are to provide a pin grip which is small; which uses a minimum of material; which is made of only two relatively simple parts; which is designed to be received in a simple, round hole; which is held frictionally in position until the soldering operation secures it permanently in position; which may be soldered by the so-called "pot soldering" operation; and which employs a resilient contact the free action of which is in no way affected by soldering.

Further objects are to provide a contact spring which is made and handled conveniently and inexpensively by coining a continuous wire to form connected springs, and which may be plated inexpensively by plating the wire before coining the same, and to provide a pin grip which may be handled inexpensively during manufacture and also during application of the pin grip to a printed circuit board by standard, commercially available mechanisms such as are now used for the handling and setting of small eyelets.

To accomplish the foregoing objects, and other objects which will hereinafter appear, my invention resides in the pin grip elements, and their relation one to another, and to a printed circuit board, as are hereinafter more particularly described in the following specification. The specification is accompanied by drawings in which.

Figures 1, 2, 3, 4, 5, 6, 7, 8:
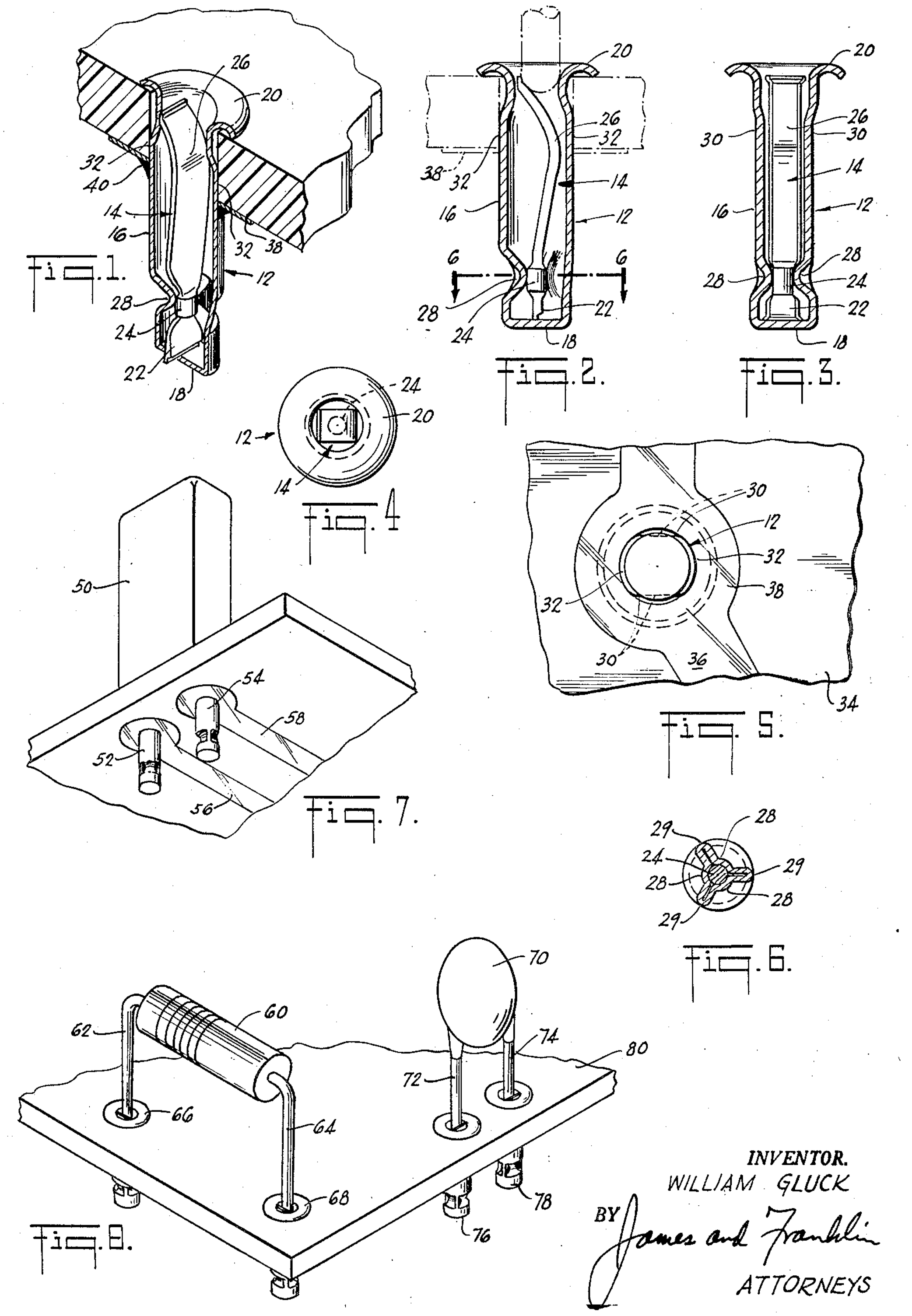
Fig. 1 is a perspective sectional view showing a pin grip embodying features of my invention applied to a printed circuit board.
Fig. 2 is a vertical section through the pin grip.
Fig. 3 is a vertical section taken on a plane perpendicular to that of Fig. 2.
Fig. 4 is a plan view of the pin grip.
Fig. 5 is a bottom view of a fragment of board with a pin grip in position before soldering.
Fig. 6 is a transverse section taken approximately in the plane of the line 6—6 of Fig. 2.
Fig. 7 is a perspective view showing a pair of pin grips receiving a detachable component.
Fig. 8 is a perspective view showing pairs of pin grips receiving other components.

Referring to the drawing, and more particularly to Figs. 1, 2 and 3, the pin grip comprises an envelope 12 and a contact spring 14 housed in said envelope. The envelope is preferably sheet-metal drawn to form a generally cylindrical barrel 16 with a closed bottom 18, and a flange 20 at the open top of the barrel.

The contact spring 14 comprises an anchor portion 24 which is locked to the envelope 12 in order to prevent escape of the contact spring. It further comprises a curved contact blade 26 which is located in the barrel 16 of the envelope.

The contact spring 14 is in this case is made of resilient metal wire coined to provide an enlargement 22 at its lower end beneath the anchor portion 24. The barrel 16 is indented and constricted as shown at 28, this constriction being located at the anchor portion 24 and serving to anchor the contact spring in the barrel.

The barrel, particularly a part within the printed circuit board, is preferably modified from circular cross-section in order to frictionally fit in a circular hole. This modification or deformation may be made in a variety of ways. In the present case, the barrel is flattened on two sides as shown at 30, Figs. 3 and 5, and expanded on two sides as shown at 32 in Figs. 1, 2, and 5. The lower end directly above bottom 18, and the upper end, immediately beneath flange 20, are left circular in section. The part of the barrel below the bottom of the board need not be flattened, but it is easier to flatten a long portion than a short portion.

While the pin grip may be used in other ways, as for example by molding insulation material around pin grips inserted in a molding cavity, the most common use for the pin grip is in combination with a printed circuit board. Fig. 5 shows the bottom of a fragment of printed circuit board 34, having a printed conductive metallic line 36 thereon. This line leads to a pin grip, and for that purpose the board 34 has a hole punched therethrough. The line 36 is preferably expanded around the hole, as indicated at 38.

After the board has been punched and printed (or vice versa) the pin grips are inserted in the holes as indicated in Figs. 1 and 2. The flange 20 bears against that side of the board which is remote from the printed line 36, 38. Subsequently the board is subjected to a soldering operation, preferably a pot soldering operation in which the bottom of the board is immersed in a pot of molten solder. The solder adheres to the printed metal 38 and the adjacent side wall of the barrel of the pin grip. The resulting fillet of solder is indicated at 40 in Fig. 1.

The pin grip is positively held against downward movement by the flange 20, and against upward movement by the solder 40. This is in addition to the primary purpose of the solder in providing electrical connection between the printed line and the pin grip.

The importance of the closed bottom 18 is that it makes possible soldering by a pot soldering operation without flow of solder inside the envelope 12. Thus, the spring contact remains free to move when receiving a pin inserted in the pin grip.

The frictional fit of the pin grip in the board is of temporary importance. It serves to hold the pin grip during handling of the board, prior to the soldering operation. The hole in the board is preferably circular, for convenience. Deformation of the circular barrel is optional, and is convenient because it provides a dependable frictional fit without requiring great accuracy in the diameter of the hole, relative to the diameter of the barrel. In other words, the tolerance in manufacture is greatly increased.

The crimping of the envelope to anchor the spring in position is done after insertion of the spring, and may be performed in varied ways. In a typical case, the envelope is indented or crimped inward at three points, as indicated at 28 in Fig. 6, leaving ridges or webs 29 therebetween. However, the desired locking indentation may be provided in other ways, or with different numbers of indentations.

Some typical ways in which the pin grips may be used are illustrated in Figs. 7 and 8. In Fig. 7 a component 50, having two pins at its base, is detachably received in a pair of spaced pin grips 52 and 54. These are connected to printed lines 56 and 58. The solder has been omitted. The component 50 might be a transistor, a piezo crystal, a diode, or other such device.

In Fig. 8 a component 60 having a pair of end leads 62 and 64 is received in a suitably spaced pair of pin grips 66 and 68. The component here illustrated is a resistor, but it will be evident that other components, having similar end leads, may be similarly mounted. Another component 70 having a pair of leads 72 and 74 is received in a spaced pair of pin grips 76 and 78. In this case the component 70 is a disc type capacitor. It will be understood that the board 80 is a printed circuit board, it being made of insulation material having conductive lines printed on the bottom surface thereof, as previously described. The same is true in Fig. 7.

Figure 9:
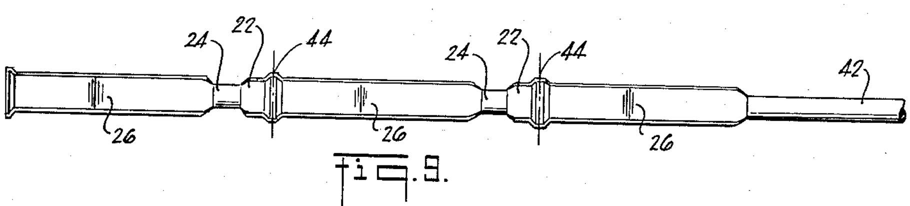
Fig. 9 is a plan view of a fragment of wire coined to form a connected series of contact springs.
Figure 10:
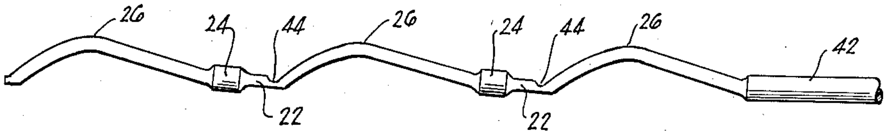
Fig. 10 is a side elevation of the same.

The contact spring may be made in varied ways but a preferred and economical method is that shown in Figs. 9 and 10 in which it will be seen that a round wire 42 is coined and thereby deformed to provide the desired enlargements 22, and curved contact blades 26. Short lengths of uncoined wire may be used as the anchor portions 24. The wire may be made of suitable resilient material such as berylium copper, phosphor bronze, brass, or even steel. This wire may be plated while still in simple, round wire form. For some purposes the plating may be silver, but in other cases a less costly plating may be used, such as tin. The coining operation does not spoil the plating, and the latter may even act as a lubricant for the coining operation. The wire may be severed at the points 44 to form individual contact springs. One advantage of working with a wire is that this severing operation may be delayed until the spring has been inserted into the envelope, or immediately preceding such insertion, thereby simplifying the handling of the tiny springs.

Figure 11:
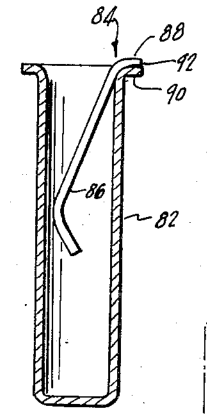
Fig. 11 is a vertical section through another form of my invention.
Figure 12:
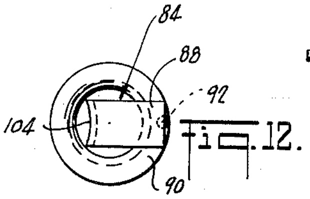
Fig. 12 is a plan view of the pin grip shown in Fig. 11.

The contact spring may be shaped and held in the envelope in other ways, and referring to Figs. 11 and 12 I there show a pin grip in which the envelope 82 may be made and dimensioned as previously described, except that there is no constriction or neck. The contact spring 84 has a curved blade 86 and an anchor portion 88. This is at the upper end of the contact, and is bent outward to overlie the flange 90. The parts 88 and 90 are spot-welded, as indicated at 92.

Figure 13:
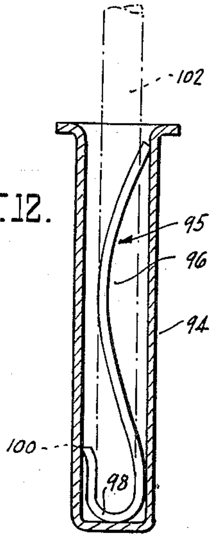
Fig. 13 is a vertical section through still another form of the invention.
Figure 14:
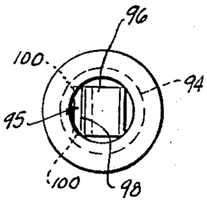
Fig. 14 is a plan view of the pin grip shown in Fig. 13.

Still another form of the invention is shown in Figs. 13 and 14. In this case, the envelope 94 may be made substantially as previously described, except that it is somewhat longer. The contact spring has a curved blade 96 and an anchor portion 98, the latter being a reversely bent or hook-like element at the lower end of the contact spring. The tip 100 of the anchor portion is an outwardly directed and rather sharp edge or burr which may be obtained as a part of the die operation which forms the contact spring. This edge 100 bites into the inner wall of the envelope, thereby anchoring the contact spring in position. For the sake of clarity, Fig. 13 departs slightly from accuracy, as will be understood by reference to Fig. 14 showing that it is the corners 100 which bite into the envelope wall.

Figure 15:
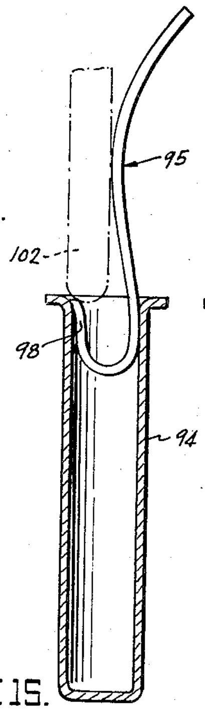
Figs. 15 and 16 show successive steps in the assembly of the contact spring and envelope for the pin grip shown in Figs. 13 and 14.
Figure 16:
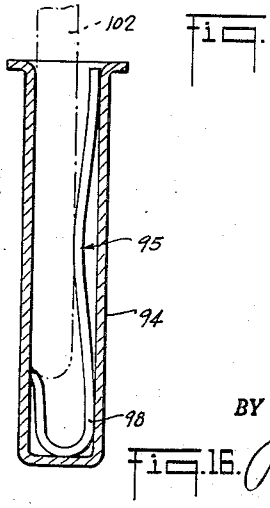

The method of insertion of the contact spring into the eyelet may insure adequate locking of the parts. This is shown in Fig. 15 in which contact spring 95 is being inserted in envelope 94 by an insertion pin 102 which initially bears against the upper end of anchor portion 98. In Fig. 16 the insertion pin 102 has pushed the contact spring 95 to the bottom of the envelope 94. The pin 102 may be so dimensioned and shaped that it then can be forced down further as indicated in Fig. 13, in which case the lower end of pin 102 enters the hook-like anchor portion 98 and forces the tip 100 outward. This insures that the corners 100 will bite into the envelope wall as desired.

It will also be understood that in both of these forms of the invention the envelope may be deformed or flattened or otherwise modified from circular cross-section in order to frictionally fit in a circular hole, as was described in connection with Figs. 3 and 5 of the drawing. This is not essential. Some purchasers may prefer a circular shape in order to more freely insert the pin grip in its hole. The others may prefer the deformation even though it may slow the insertion operation, in order to better guard against accidental loss of a pin grip from its hole prior to the pot-soldering operation. It will therefore be understood that the deformation shown in Fig. 5 (or any other departure from circular shape) may be used in the pin grips shown in Figs. 12 and 14, and conversely, that the circular shape shown in Figs. 12 and 14 may be used in the pin grip shown in Fig. 5.

The contact spring of Figs. 11 and 13 is flat and may be made of flat material. If a flat wire which requires plating is used it may be plated before shaping the contact spring in a progressive die or the like. Preferably a material is selected which is sufficiently hard without coining and without heat treatment. It is also feasible to use a material such as nickel silver which has the desired hardness and resilience, and which does not corrode and therefore requires no plating.

Referring to Fig. 12 the contact blade is shown slightly concave at 104. This is optional, and similar shaping with a slight concavity may be provided in the pin grip of Fig. 4 and Fig. 14, as well as that shown in Fig. 12. Conversely, the flat configuration shown in Figs. 4 and 14 may equally well be used in the pin grip of Fig. 12.

It is important to understand that the pin grip here disclosed is very tiny, and that its size has been exaggerated in the drawings for clarity. In a typical case the envelope has an outside diameter of 0.060 inch with a wall thickness of 0.007 inch. The diameter of the flange is about 0.080 inch. The length of the envelope is about ¼ inch. The contact spring has a width of about 0.036 inch, and a thickness of from 0.005 to 0.008 inch. The pin or wire to be received in the pin grip has a diameter of from 0.016 to 0.018 inch.

The envelope is preferably dimensioned the same as previously commercialized eyelets. This has the advantage that standard eyeletting machines and the hopper and feed mechanisms thereof may be used to handle the present relatively minute pin grips. Of course, the envelope differs importantly from an eyelet in having a closed instead of an open bottom end.

It is believed that the construction, method of assembly, and method of use of my improved pin grip, as well as the advantages thereof, will be apparent from the foregoing detailed description. It will also be apparent that while I have shown and described my invention in several preferred forms, changes may be made in the structures shown without departing from the scope of the invention, as sought to be defined in the following claims.

I claim:

1. A pin grip comprising a metal envelope and a contact spring therein, said envelope comprising a generally cylindrical barrel, a closed bottom, a flange at the top, and a constricted neck spaced somewhat above the bottom, said contact spring comprising an anchor portion near its lower end at the neck of the barrel, an enlargement beneath said anchor portion, and a bowed contact blade above said anchor portion, said contact spring being anchored in said barrel by the neck of the barrel engaging the anchor portion of the spring, said barrel and bottom being sealed against the passage therethrough of molten solder from the outside to the inside.

2. A pin grip comprising a metal envelope and a contact spring therein, said envelope comprising a generally cylindrical barrel, a closed bottom, a flange at the top, and a constricted neck spaced somewhat above the bottom, said contact spring comprising an anchor portion near its lower end at the neck of the barrel, an enlargement beneath said anchor portion, and a bowed contact blade above said anchor portion, said contact spring being anchored in said barrel by the neck of the barrel engaging the anchor portion of the spring, a portion of said barrel being modified from circular cross-section in order to frictionally fit in a circular hole, said barrel and bottom being sealed against the passage therethrough of molten solder from the outside to the inside.

3. A pin grip for use with printed circuitry, said pin grip comprising an envelope and a contact spring therein, said envelope being sheet metal drawn to form a generally cylindrical barrel with a closed bottom and a flange at the open top, said contact spring being made of resilient metal wire coined to provide an enlargement at its lower end beneath an anchor portion, and a bowed contact blade above said anchor portion, said barrel being indented and constricted at said anchor portion in order to anchor said contact spring in said barrel, said barrel and bottom being sealed against the passage therethrough of molten solder from the outside to the inside.

4. A pin grip for use with printed circuitry, said pin grip comprising an envelope and a contact spring therein, said envelope being sheet metal drawn to form a generally cylindrical barrel with a closed bottom and a flange at the open top, said contact spring being made of resilient metal wire coined to provide an enlargement at its lower end beneath an anchor portion, and a bowed contact blade above said anchor portion, said barrel being indented and constricted at said anchor portion in order to anchor said contact spring in said barrel, a portion of said barrel being modified from circular cross-section in order to frictionally fit in a circular hole in a printed circuit board, said barrel and bottom being sealed against the passage therethrough of molten solder from the outside to the inside.

5. In combination, a printed circuit board, and a pin grip as defined in claim 1, said board having a printed circuit line, a hole at said line, said pin grip being received in said hole with the flange against the side of the board remote from the printed circuit line, and solder connecting said printed circuit line and the adjacent portion of the exterior of the barrel of the pin grip.

6. In combination, a printed circuit board, and a pin grip as defined in claim 3, said board having a printed circuit line, a hole at said line, said pin grip being received in said hole with the flange against the side of the board remote from the printed circuit line, and solder connecting said printed circuit line and the adjacent portion of the exterior of the barrel of the pin grip.

7. In combination, a printed circuit board, and a pin grip as defined in claim 2, said board having a printed circuit line, a round hole at said line, said pin grip being frictionally received in said hole with the flange against the side of the board remote from the printed circuit line, and solder connecting said printed circuit line and the adjacent portion of the exterior of the barrel of the pin grip, whereby the pin grip is positively held against movement in one direction by the flange, and in opposite direction by the solder.

8. In combination, a printed circuit board, and a pin grip as defined in claim 4, said board having a printed circuit line, a round hole at said line, said pin grip being frictionally received in said hole with the flange against the side of the board remote from the printed circuit line, and solder connecting said printed circuit line and the adjacent portion of the exterior of the barrel of the pin grip, whereby the pin grip is positively held against movement in one direction by the flange, and in opposite direction by the solder.

9. A pin grip comprising a metal envelope and a contact spring therein, said envelope comprising a generally cylindrical barrel, a closed bottom, a flange at the top, and a constricted neck spaced somewhat above the bottom, said contact spring comprising an anchor portion near its lower end at the neck of the barrel, an enlargement beneath said anchor portion, and a bowed contact blade above said anchor portion, said contact spring being anchored in said barrel by the neck of the barrel engaging the anchor portion of the spring.

10. A pin grip for use with printed circuitry, said pin grip comprising an envelope and a contact spring therein, said envelope being sheet metal drawn to form a generally cylindrical barrel with a closed bottom and a flange at the open top, said contact spring being made of resilient metal wire coined to provide an enlargement at its lower end beneath an anchor portion, and a bowed contact blade above said anchor portion, said barrel being indented and constricted at said anchor portion in order to anchor said contact spring in said barrel.

References Cited in the file of this patent

UNITED STATES PATENTS

| | | |
|---|---|---|
| 1,187,301 | Goodridge | June 13, 1916 |
| 1,906,469 | Knutson | May 2, 1933 |
| 2,593,479 | Nieter | Apr. 22, 1952 |
| 2,638,573 | Glickman et al. | May 12, 1953 |
| 2,762,024 | Heath | Sept. 4, 1956 |
| 2,802,995 | Mautone et al. | Aug. 13, 1957 |
| 2,872,655 | Damon | Feb. 3, 1959 |